United States Patent [19]
Liaw et al.

[11] Patent Number: 5,543,345
[45] Date of Patent: Aug. 6, 1996

[54] METHOD FOR FABRICATING CROWN CAPACITORS FOR A DRAM CELL

[75] Inventors: Ing-Ruey Liaw; Meng-Jaw Cherng, both of Hsinchu, Taiwan

[73] Assignee: Vanguard International Semiconductor Corp., Hsin-Chu, Taiwan

[21] Appl. No.: 579,167

[22] Filed: Dec. 27, 1995

[51] Int. Cl.⁶ .......................... H01L 21/70; H01L 27/00
[52] U.S. Cl. .................. 437/52; 437/60; 437/919
[58] Field of Search ................... 437/47–48, 52, 437/60, 919; 148/DIG. 14; 257/306–310

[56] References Cited

U.S. PATENT DOCUMENTS

| | | | |
|---|---|---|---|
| 5,192,702 | 3/1993 | Tseng | 437/52 |
| 5,266,512 | 11/1993 | Kirsch | 437/52 |
| 5,372,965 | 12/1994 | Ryou | 437/52 |
| 5,380,673 | 1/1995 | Yang et al. | 437/47 |
| 5,389,560 | 2/1995 | Park | 437/52 |
| 5,389,568 | 2/1995 | Yun | 437/60 |
| 5,399,518 | 3/1995 | Sim et al. | 437/52 |
| 5,443,993 | 8/1995 | Park et al. | 437/52 |

*Primary Examiner*—H. Jey Tsai
*Attorney, Agent, or Firm*—George O. Saile; William J. Stoffel

[57] ABSTRACT

A method is provided for fabricating a single crown electrode for a capacitor for semiconductor memory devices. A conductive layer is formed over a multi-layer gate and insulation structure. The conductive layer includes a portion extending through a contact hole to thereby electrically connect the conductive layer with an active region of a transistor formed in the substrate Next, a novel groove is etched in the conductive layer between adjacent memory cells. Sidewall spacers are formed on the groove. The conductive layer is anisotropically etched using the spacers as an etching mask, thereby forming a plurality of electrodes having upright portions. The etching exposes the first insulation layer in the area under the grooves, but leaves a thickness of the base conductive layer to form the bottom of the electrode. The spacers then are removed and a conformal dielectric layer is formed over the surface. Lastly, a top plate electrode is formed over the conformal dielectric layer.

22 Claims, 3 Drawing Sheets

METHOD FOR FABRICATING CROWN CAPACITORS FOR A DRAM CELL

BACKGROUND OF INVENTION

1) Field of the Invention

The present invention relates generally to fabrication of capacitors in a DRAM cell and particularly to a method for fabricating a three dimensional storage electrode for high reliability and large cell capacitance for memory cells and more particularly a method to form a crown capacitor.

2) Description of the Prior Art

Dynamic random access memories (DRAMs) have a plurality of memory cells, each of which generally includes a storage capacitor and a transistor serving as a transfer gate for storing or eliminating charges. The plurality of memory cells are arranged on a substrate in a matrix arrangement and operate to permit only a single cell in the memory to be selected by means of two dimensional addressing within a given time period. A bit line (data line) voltage is supplied to the storage capacitor via a transistor so as to write information on each memory cell. Also, in order to read out the written information, the storage capacitor is connected to the data line via a gate and the voltage of the storage capacitor is thus monitored.

A serious obstacle to increasing packing density in dynamic random access memories (DRAMs) is the decrease in cell capacitance caused by reduced memory cell area. The problem of decreased cell capacitance must be solved to achieve higher packing density in a semiconductor memory device, since decreased cell capacitance degrades read-out capability and increases the soft error rate of memory cell as well as consumes excessive power during low-voltage operation by impeding device operation.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, capacitors having a three-dimensional structure have been suggested to improve cell capacitance. Such capacitor include, for example double-stacked, fin-structured, cylindrical, spread-stacked, and box structured capacitors.

Since both outer and inner surfaces can be utilized as an effective capacitor area, the cylindrical structure is favorably suitable to the three-dimensional stacked capacitor, and is more particularly suitable for an integrated memory cell which is 64 Mb or higher. Also, an improve stacked capacitor has recently been presented, where pillars or another inner cylinder is formed in the interior of the cylinder. Not only may both of the inner and outer surfaces of the cylinder be utilized as the effective capacitor area, but also the outer surface of the pillars or the inner cylinder formed in the interior of the cylinder.

The following U.S. patents show related processes and capacitor structures: U.S. Pat. Nos. 5,399,518, Sim et al.; 5,389,568, Yun; 5,389,560, Park; 5,380,673, Yang; 5,372,965, Ryou. Many of the prior art methods require substantially more processing steps or/and planar structures that make the manufacturing process more complex and costly. For example, U.S. Pat. No. 5,399,518 to Sim teaches a method of forming a double-cylindrical storage electrode of a capacitor. The method begins by forming an oxide cylinder on a polysilicon layer. Next, first and second spacers are formed on the sidewalls of the oxide cylinder. The uncovered areas of the polysilicon layer are etched to define electrodes. A second etch is used to etch out an insulation layer beneath the electrode. Next, the oxide spacer and second spacer are removed leaving the first silicon nitride spacer on the electrode top surface. Using the nitride spacer as a mask, top portions of the electrode are removed forming a cylindrical upward stepped portion on the electrode surface. Third spacers are formed on both sides of the upward stepped portion. Using the third spacers as a mask, the electrode is etched forming, under the third spacers, the two crowns of the double cylindrical electrode. However, this method could be improved upon by reducing the number of process steps. This method has the disadvantage of the extra process steps in forming an oxide cylinder and the first and second spacers. Moreover, two etch steps are required just to define the individual electrodes. Overall, the method of Sim could be improved if a method were invented that did not require an oxide cylinder and three sets of spacers to define a double crown and that did not require two etches just to define the individual electrodes.

There is a challenge to develop methods of manufacturing crown capacitors that minimize the manufacturing costs and maximize the device yields. In particular, there is a challenge to develop a method which minimizes the number of process steps and provide maximum process tolerance to maximize product yields.

SUMMARY OF THE INVENTION

It is an object of the present invention to provide a novel method for fabricating a single crown capacitor of a semiconductor memory device, which ensures high reliability and large cell capacitance of the memory device.

It is another object of the present invention to provide a method for fabricating a capacitor of a semiconductor memory device, which is easy to manufacture, inexpensive to manufacture and uses a minimum number of process steps and planar structures.

To accomplish the aforementioned objectives, the present invention provides a method of manufacturing a capacitor of a semiconductor memory device which is characterized in that a conductive layer, connected to a node contact (e.g., source), is formed over associated field effect transistors. Next, using photo patterning techniques, a groove is formed in the conductive layer. The groove can have any shape, but preferably the un-grooved polysilicon surface is annular or square. The un-grooved polysilicon areas will form the electrodes. Spacers are then formed on the sidewalls of the groove. The conductive layer is anisotrophically etched using the spacer as an etch mask thus forming an upward extending portion (crown) from the remaining conductive layer under the spacer. The un-grooved areas of the polysilicon are etched completely through thereby defining the individual electrodes. A capacitor dielectric layer and a top plate electrode layer are formed over the crown electrode to complete the capacitor.

The method of the present invention uses fewer process steps than the prior art processes to form a single crown electrode. The invention's combination of the groove and the spacer allows only one etch step to define both the upright crown portion and the individual electrodes by removing all the polysilicon between adjacent electrodes.

Briefly, the present invention provides a method of fabricating crown shaped electrodes for capacitors for semiconductor memory devices including a semiconductor substrate having a multi-layer gate and insulation structure formed thereon. The method begins by forming a first conductive layer on the multi-layer gate and insulation structure. The first conductive layer includes a portion extending through a contact hole provided in the gate and insulation structure to thereby electrically connect the first conductive layer with an active region of a transistor formed in the substrate. A groove is then formed in the first conductive layer defining areas for a plurality of spatially separated electrodes (e.g., individual cell units) on the first conductive layer. The groove is formed between the adjacent electrodes. The groove has vertical sidewalls and has a depth less than the thickness of the first conductive layer. First spacers are formed on the sidewalls of the groove. The first conductive layer is anisotropically etched using the spacers as an etching mask, thereby forming a plurality of electrodes having single upright crowns portions. The anisotropic etch exposes the insulation structure in the area under the grooves, but leaves a thickness of the first conductive layer in the areas of the individual cell units. The spacers are removed. A conformal dielectric layer is formed coveting at least the electrodes and the exposed insulation structure. Next a top plate electrode is formed over said conformal dielectric layer thereby completing the capacitor for a memory cell.

DETAILED DESCRIPTION OF THE PREFERRED EMBODIMENTS

Figure 5:
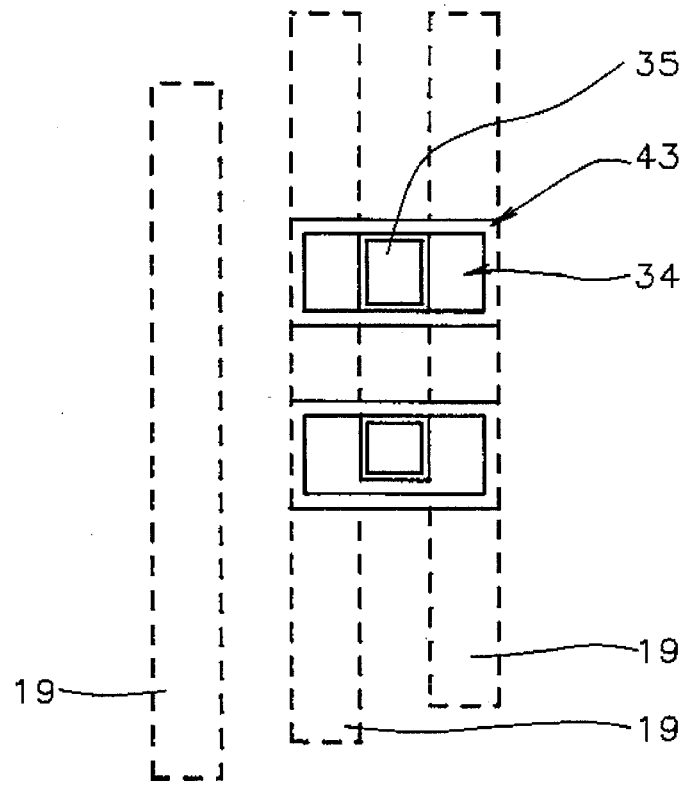
FIG. 5 is a top plan view depicting a method for manufacturing a crown capacitor according to the an embodiment of the current invention showing where the storage electrode has a rectangular shape.
Figure 6:
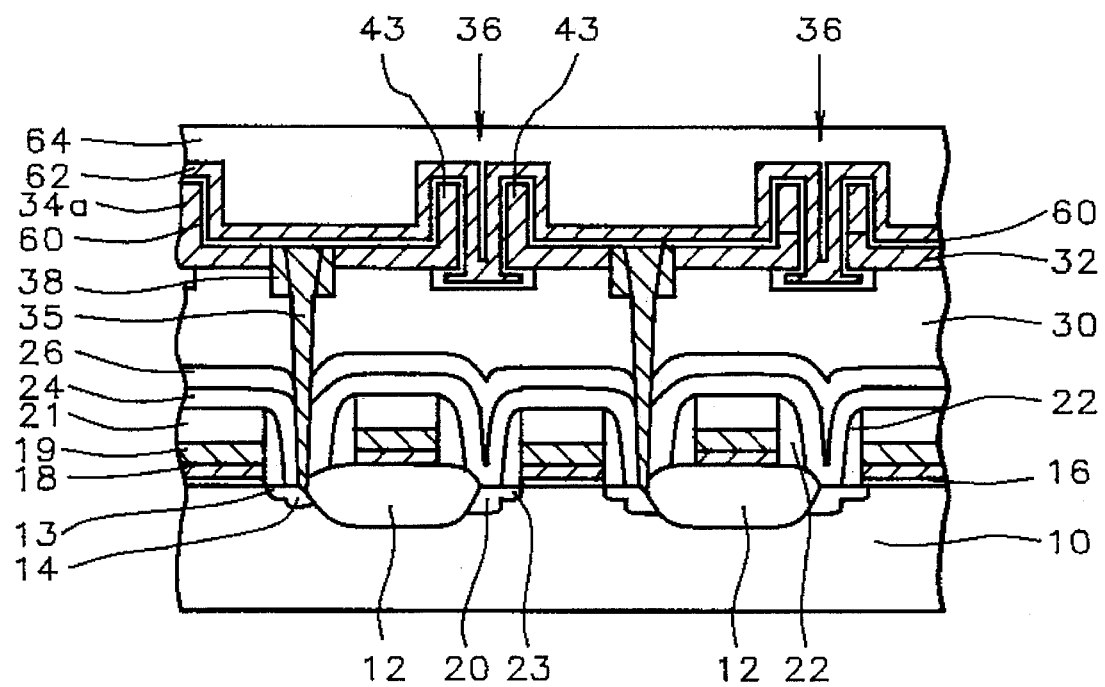
FIG. 6 is a cross sectional view for illustrating another embodiment for a method for manufacturing a crown capacitor of a semiconductor memory device according to the present invention where the electrode is formed only from one conductive layer.

To achieve the objectives of this invention, the method for forming a DRAM storage capacitor having a crown electrode is described in detail. The sequence of fabrication steps are shown in FIGS. 1 through 4. A top plan view is shown in FIG. 5. Another embodiment for the method is shown in FIG. 6 where the electrode is formed from only one conductive layer (No base conductive layer 32 is formed). The process for forming the field oxide and the field effect transistor structure as presently practiced in manufacturing DRAM cells are only briefly described in order to better understand the current invention. It should be well understood by one skilled in the art that by including additional process steps not described in this embodiment, other types of devices can also be included on the DRAM chip. For example, P wells in the P substrate and CMOS circuit can be formed therefrom. It should also be understood that the figures depict only two DRAM storage cells out of a multitude of cells that are fabricated simultaneously on the substrate.

Figure 1:
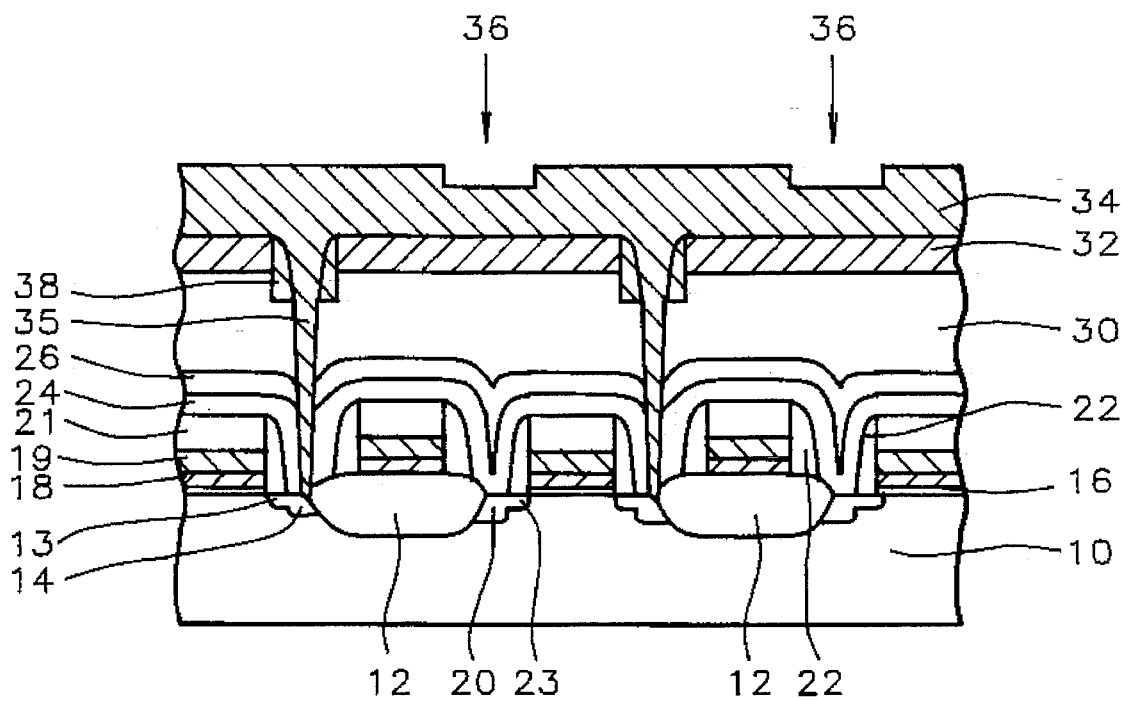
FIGS. 1 through 4 are cross sectional views for illustrating an embodiment for a method for manufacturing a crown capacitor of a semiconductor memory device according to the present invention.

Referring now to FIG. 1, a cross-sectional view of the substrate 10 having a partially completed DRAM cell formed on the substrate surface, is schematically shown. A field oxide layer 12 is formed on a semiconductor substrate 10 for defining active regions and isolation regions. The preferred substrate is composed of a P-type single crystal silicon having a (100) crystallographic orientation. A relatively thick field oxide (FOX) 12 is formed around the active device areas to electrically isolate these areas. This field oxide is formed by masking the active device areas with a thick silicon oxide (pad oxide) and a thicker silicon nitride layer which forms an oxidation barrier. The silicon substrate is then oxidized in an oxidizing ambient to form the field oxide the preferred thickness being in the range of about 4000 to 6000 Å.

The semiconductor device is then formed in the active device area after removing the silicon nitride barrier layer and the pad oxide in a convention wet etch. The most commonly used device for dynamic random access memory is MOSFET. This device is formed by first thermally oxidizing the active device area to form a thin gate oxide 16. The preferred thickness being from about 90 to 200 Å.

An appropriately doped polysilicon layer, a tungsten silicide layer, and an insulating layer are deposited on substrate 10 and conventionally photolithographic—etching techniques are used to pattern the polysilicon layer 18, tungsten silicide layer 19, and the insulating layer 21.

This patterning forms the gate electrode 16, 18, 19, 21 of the MOSFET in the active device areas and conductive patterns elsewhere on the substrate having an insulting layer thereon. Portions of the conductive patterns form the word lines that electrically connect the MOSFET gate electrode to the appropriate peripheral circuits on the DRAM chip. The lightly doped source drain 14 20 of the N-channel MOSFET is formed next, usually by implanting an N-type atomic species, such as arsenic or phosphorus through the spaces between the gate electrodes 18 19 21. For example, a typical implant might consist of phosphorus P31 at a dose of between about 1E13 and 10E13 atoms/cm$^2$ and at an energy between about 30 and 80 Kev.

After forming the lightly doped source/drain 13 23, sidewall spacers 22 are formed on the gate electrode sidewalls. These sidewall spacers 22 are formed by depositing a low temperature silicon oxide and anisotropically etching back to the silicon surface. For example, the silicon oxide could be a chemical vapor deposition using tetraethoxysilane (TEOS) at a temperature in the range of about 650° to 900° C. and the etch back performed in a low pressure reactive ion etcher.

The source/drain regions 14 20 of the MOSFET are now implanted between the spacers 22 with a N type atomic species, for example, arsenic (As75), to complete the source/drain 14 20. The implantation is usually done through a thin layer of silicon oxide of about 200 to 300 Å in thickness to minimize implant channeling and to protect against contamination by metals and other impurities. A typical implantation dose being between about 2E15 and 1E16 atoms/cm$^2$ and an energy of between about 20 and 70 Kev.

Following this, a first conformal insulating layer 24 is formed over the substrate surface and contacts the source and drain areas 14 20 as shown in FIG. 1. The conformal insulating layer 24 is can be formed of silicon nitride or silicon oxide and is preferably formed of silicon oxide. A silicon oxide layer 24 can be formed by a low temperature Tetraethylorthosilicate (TEOS) process. The first conformal layer 24 preferably has a thickness in the range between about 1000 and 2000 Å.

A second conformal insulation layer 26 is formed over the conformal insulating layer 24. The second conformal insulation layer 26 can be formed of silicon nitride and silicon dioxide. The second insulation layer 26 is preferably formed of silicon dioxide preferably by a low temperature chemical vapor deposition using tetraethoxysilane (TEOS). The layer 26 has a thickness in the range between about 500 and 1500 Å. Metal layers and patterns, such as tungsten silicide bit lines (not shown) can be formed over insulating layers 24 and 26.

A planarizing first insulation layer 30 is formed over the conformal insulation layer 26. The first insulation layer 30 can be formed of spin-on-glass (SOG), silicon oxide, and borophosphosilicate glass (BPSG). The first insulation layer 30 is preferably formed of a borophosphosilicate glass. A dielectric layer 30, such as borophosphosilicate glass, can be formed by low pressure chemical vapor deposition (LPCVD) using tetraethylorthosilicate (TEOS) as a reactant. Boron and phosphorus are added to the ambient during the formation of the borophosphosilicate glass layer. The BPSG insulation layer 30 is thermally treated at a temperature of 850° C. for 30 minutes to cause flow and planarization. The first insulating layer 30 can have a thickness in the range between about 3000 and 5000 Å and more preferably a thickness of about 4000 Å.

The remainder of this embodiment relates more specifically to those objects of the invention, which relate to the formation of the crown shaped storage capacitor having increased capacitance and also providing a more manufacturable process. The capacitor structure is formed having a vertical crown first electrode which can have any number of shapes comprising cylindrical, rectangular, triangular or irregular depending on the application. A base conductive layer 32 is formed over the first insulation layer 30. The base conductive layer 32 can be formed of in situ doped polysilicon material. The base conductive layer is preferably composed of polysilicon formed using a LPCVD reactor at a process temperature of between about 550° and 650° C. The polysilicon layer 32 can be doped N-type by ion implantation using, for example, arsenic ions and having an implant dose of between about 1E15 and 20E15 atoms/cm$^2$ and an ion energy of between about 20 and 80 Kev. The base conductive layer can have a dopant concentration in the range of between about 1E20 and 1E22 atoms/cm$^3$ and preferably a concentration of about 10E21 atoms/cm$^3$. Alternatively, the polysilicon layer can be doped in situ during the polysilicon deposition. The base conductive layer 32 preferably has a thickness in the range between about 2000 and 4000 Å and more preferably a thickness of about 3000 Å.

As a beginning step in forming electrode contacts to the drains (nodes), an opening or channel is formed over the drains 14 through the base conductive layer 32 and through an upper portion of the first insulation layer 30. The opening can have a depth in the in the range between about 1000 and 2000 μm.

Sidewall spacers 38 are formed on the sidewalls of the channel in the base conductive layer 32 and first insulation layer 30 in the opening. The sidewall spacers 38 can be formed of silicon oxide, silicon nitride, and polysilicon material. The sidewall spacers 38 are preferably formed of polysilicon. The sidewall spacers have a thickness in the range between about 500 and 1500 Å.

After this, a node contact hole is etched through the first insulation layer and the underlying layers over the drains 14 as shown in FIG. 1. The contact hole etch uses the spacers 38 as a mask. The hole can be formed by using a convention photo-etch process. The sidewall spacers 28 allow the connection 35 to be more precisely defined thus allowing the capacitor to be further miniaturized. The contact hole is opened down to expose the drains or source 14.

Next a first conductive layer 34 is formed over the base conductive layer and fills the hole thus forming an electrical contact 35 to the source/drain 14. The first conductive layer can be formed of polysilicon material. The polysilicon first conductive layer can be implanted with Arsenic with a dose in the range between 1E15 and 2E16 and an energy between 30 and 45 keV thus giving the first conductive layer 34 a concentration in the range between about 10E20 and 10E22 atoms/cm$^3$. The first conductive layer preferably has a thickness in the range between about 4000 and 12,000 and more preferably a thickness of about 5000 Å.

A first photoresist mask (not shown) is formed over the first conductive layer 34 thus forming a pattern for defining areas for individual cell units on the first conductive layer. Upper portions of the first conductive layer 34 are etched through the first photoresist mask forming a groove 36 in the first conductive layer 34.

The groove 36 defines areas for a plurality of spatially separated individual cell units on said first conductive layer. The groove is formed between said adjacent cells (e.g., electrodes). The groove 36 has vertical sidewalls and a depth less than the thickness of said first conductive layer. The groove 36 preferably has a depth in the range between about 500 to 2000 Å and a depth more preferably of about 1000 Å. Next, the first photoresist mask is removed.

Figure 2:
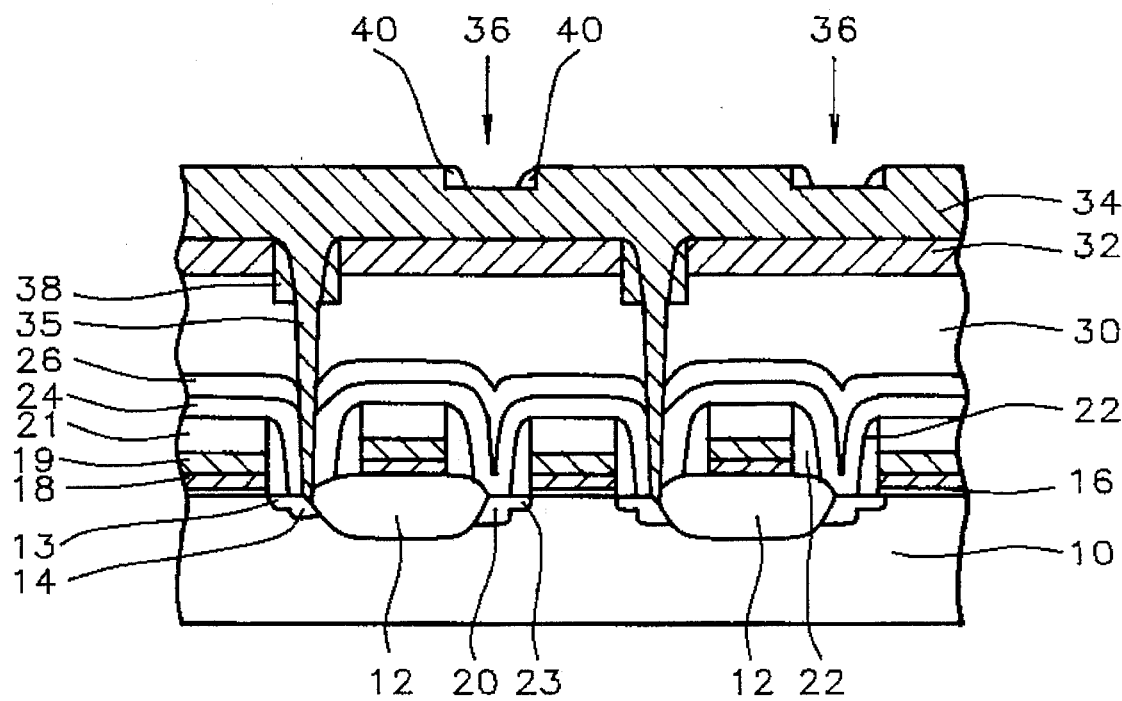

Referring to FIG. 2, first spacers 40 are formed on the sidewalls of the groove. The first spacers 40 can be formed of silicon oxide using a low temperature TEOS process or of silicon nitride. The silicon oxide first spacers are fabricated by forming a conformal silicon oxide layer over the substrate surface. Then the conformal silicon oxide layer is anisotropically etched. The first spacers 40 preferably have a width in the range between about 0.1 and 0.2 μm.

Figure 3:
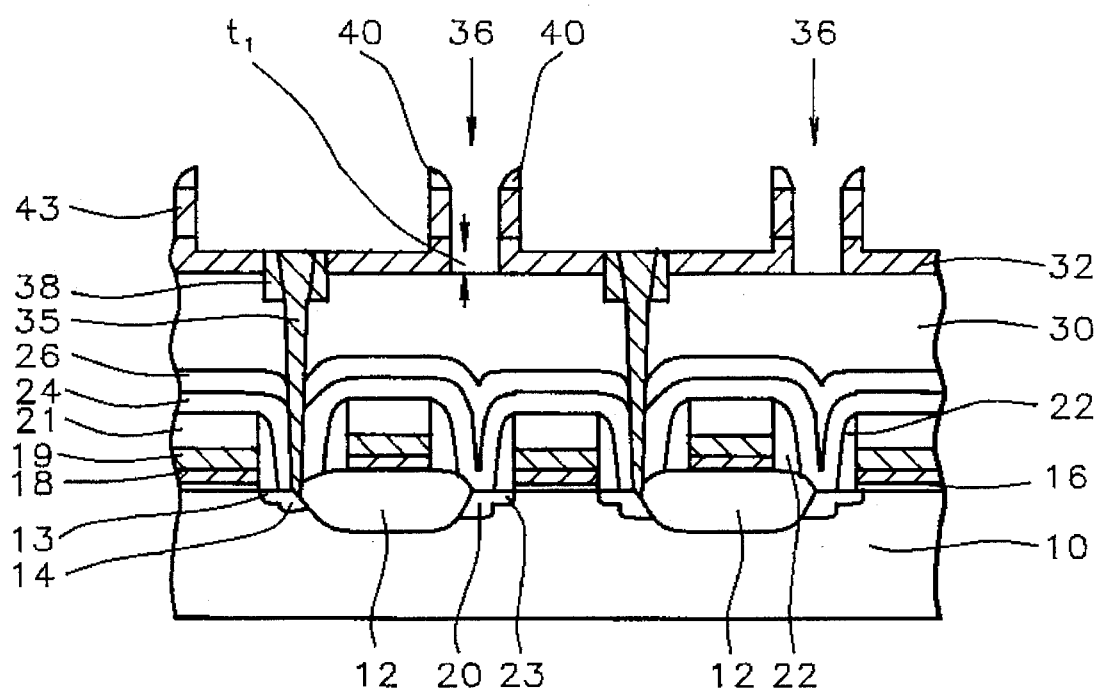

Now turning to FIG. 3, portions of the first conductive layer 34 and upper portions of the base conductive layer are anisotropically etched using the first spacers 40 as an etching mask, thereby forming a plurality of upright portions 43 within the areas for individual memory cell units (e.g., individual electrodes). The etch also removes all the polysilicon under the groove 36 to define the individual electrodes. The etching removes a thickness of the base conductive layer less than the entire thickness of the base conductive layer forming the bottom base portion of the electrode 32. The anisotropic etch consumes between about 5000 and 8000 Å of the base conductive layer 32 and first conductive layer 34 and more preferably about 5000 Å. The thickness $t_1$ of the remaining base conductive layer 32 in the base portion of the electrode is preferably in the range of between about 500 and 2000 Å and more preferably about 1000 Å.

The combination of the groove 36 and the first spacers 40 allow only one etch step to define both the upright portions 43 and define the individual electrodes by removing all the polysilicon layer beneath the groove 36. These features significantly reduce the number of process steps and reduce manufacturing costs.

Figure 4:
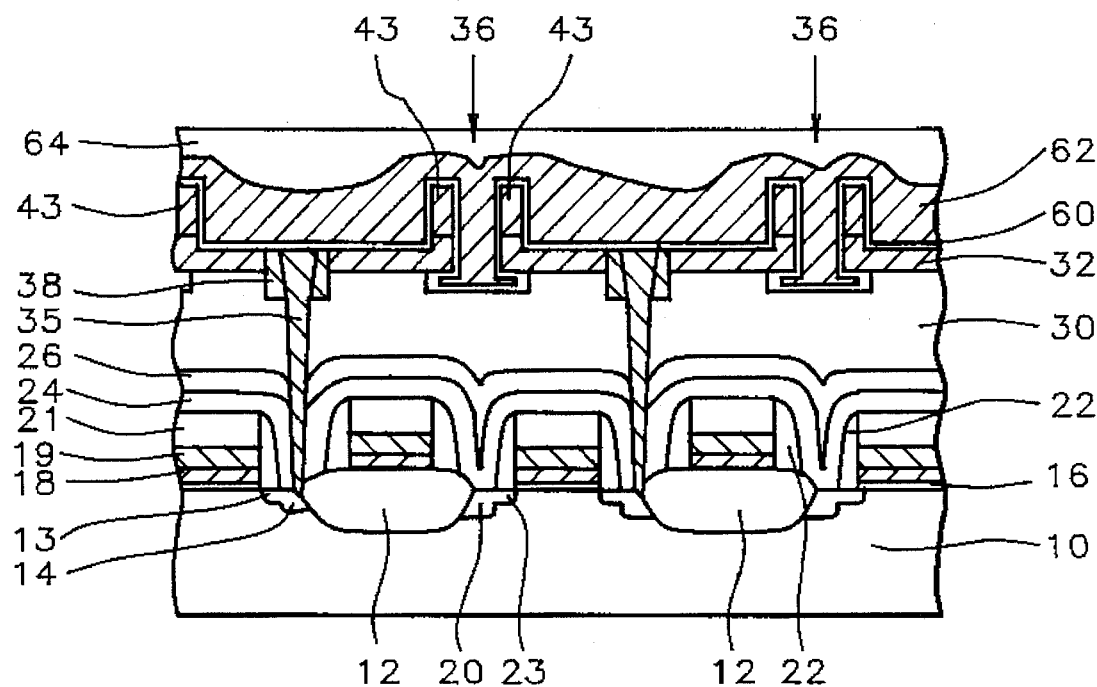

As shown in FIG. 4, the first insulation layer 30 under the groove 36 is etched using the remaining first and first conductive layers 32, 34 as an etch mask and the spacer 40 is removed. The etch can be an isotropic etch. The etch removes a thickness from the first insulation layer of between about 2000 and 3000 Å.

At least upright portions 43, the base conductive layer 32 and the first insulation layer 34 are covered with a conformal dielectric layer 60 as shown in FIG. 4. The conformal dielectric layer is preferably formed of $Ta_2O_5$, silicon nitride, and silicon oxide material. Preferably, the conformal dielectric layer is formed of silicon oxide/silicon nitride (ON). The conformal dielectric layer 60 preferably has a thickness in the range between about 45 and 60 Å and preferably has a thickness of about 50 Å.

A top plate electrode 64 is formed over the capacitor dielectric layer 62 as shown in FIG. 7. The top plates 62 of adjacent capacitors electrically connected. The top plate electrode can be formed of polysilicon. The top plate electrode 62 preferably has a thickness in the range between about 1000 and 2000 Å.

Lastly, a top capping insulating layer 64 is formed over the top plate 60. The top insulating layer can have a thickness in the range of between about 4000 and 6000 and a thickness more preferably about 4500 Å. The top insulation layer 64 can be formed of silicon oxide and borophosphosilicate glass materials.

FIG. 5 shows a top down view of the electrode at the point in the process after the first spacers are removed. FIG. 5 shows a preferred embodiment where the electrode has a rectangular shape. The electrode can have any shape, such as square, circular, triangular or irregular, depending on the application.

FIG. 6 shows another embodiment of the current invention where only a first conductive layer is formed over the first isolation layer 26 and also fills the contact hole to form an electrical connection 35 to the active areas 13 14. (A base conductive layer is not formed). The process to form the single crown capacitor is the same as describe previously where the first conductive layer 34A functions as both the base 32 and first conductive layers 34 previously described. The first conductive layer 34A in this embodiment preferably has a thickness in the range of between about 6000 and 12000 Å and more preferably about 8000 Å.

According to the present invention, a storage electrode of a capacitor can be obtained from a single conductive layer. This makes the electrodes stronger and more stable. The ability to form a crown capacitor using sidewall spacers to define the electrodes improves the layout precision thus allowing a more compact capacitor while maximizing the capacitance of the electrodes.

The method of the present invention uses fewer process steps than the prior art processes to form a single crown capacitor. The process sequence for forming a single crown electrode comprises only (1) forming a mask on the polysilicon layer 34, (2) etching a grooves 36 in a polysilicon layer, (3) forming sidewall spacers 40, and (4) etching to define the crown electrode. An important feature of this invention is the dual function of the groove. First, the groove is formed in areas where the polysilicon will be removed in the etch step. Second, the sidewalls of the groove 36 are used to form spacers 40 which are used as a mask in the etch step to define the vertical crowns of the electrode. The combination of the groove and the spacers allows the etch step to define both the crown portion and the individual electrodes by removing all the polysilicon between adjacent electrodes. This one step etch reduces the number of process steps, reduces process complexity, reduces manufacturing costs and increase process tolerances.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a crown capacitor for semiconductor memory devices, said memory devices having a field effect transistor including a source, a drain, and a gate element, and a first insulation layer over said field effect transistor, which comprises the steps of:

forming a base conductive layer over said first insulation layer;

forming a contact hole through said base conductive layer and said first insulating layer over source regions that exposes said source;

forming a first conductive layer over said base conductive layer and filling said contact hole thereby forming an electrical connection to said source;

forming a first photoresist mask for defining areas for a plurality of spatially separated individual cell units on said first conductive layer;

etching portions of said first conductive layer through said first photoresist mask forming an groove in said first conductive layer between adjacent cells units, said groove having vertical sidewalls and having a depth less than a thickness of said first conductive layer;

removing said first photoresist mask;

forming first spacers on said sidewalls of said groove;

anisotropically etching said base conductive layer and said first conductive layer using said spacers as an etch mask, thereby forming a plurality of electrodes having upright extending portions, said anisotropic etching exposing said first insulation layer in an area under said groove but leaving a thickness of said base conductive layer in the areas of said individual cell units and isotropically etching said exposed first insulating layer under said groove using said plurality of said electrodes as an etch mask;

removing said spacers;

forming a conformal dielectric layer covering at least said electrodes, said base conductive layer, and said first insulation layer; and forming a top plate electrode over said conformal dielectric layer thereby forming a crown capacitor.

2. The method of claim 1 which further includes, after forming said base conductive layer, forming an opening having sidewalls through said base conductive layer and through a portion of said first insulation layer, forming polysilicon spacers on the sidewalls of said opening and using said spacers as an etch mask to form said contact hole.

3. The method of claim 1 where said base conductive layer has a thickness in a range between about 2000 and 4000 Angstroms and said base conductive layer is formed of polysilicon.

4. The method of claim 1 wherein said base conductive layer has a dopant concentration in a range of between about 1E20 and 1E 22 atoms/cm³.

5. The method of claim 1 wherein said first conductive layer has a thickness in a range between about 4000 and 12000 Angstroms and said first conductive layer is formed of polysilicon.

6. The method of claim 1 wherein said first conductive layer has a dopant concentration in a range of between about 1E20 and 1E22 atoms/cm³.

7. The method of claim 1 wherein the thickness (t1) of said base conductive layer after said anisotropically etching is in a range between about 500 and 2000 Angstroms and said groove has a depth in a range between about 500 and 2000 Angstroms.

8. The method of claim 1 wherein said first spacers have a width in a range between about 0.1 and 0.2 um and said first spacers are formed a material selected from the group consisting of silicon nitride and silicon oxide.

9. The method of claim 1 wherein said conformal dielectric layer has a thickness in a range between about 45 and 60 Anstroms and is formed of a material selected from the group consisting of silicon oxide, silicon nitride, and $Ta_2O_5$.

10. The method of claim 1 wherein said top plate electrode has a thickness in a range between about 1000 and 2000 Angstroms and can be formed of polysilicon.

11. A method of fabricating dynamic random access memory devices, said memory devices having a source, a drain, a gate element and a capacitor, which comprises the steps of:

forming a first insulation layer over a substrate surface;

forming a base conductive layer over said first insulation layer;

forming a channel through said base conductive layer and through an upper portion of said first insulation layer, said channel having vertical sidewalls;

forming polysilicon sidewall spacers on said sidewalls of said channel;

forming a contact hole using said polysilicon sidewall spacers as an etch mask through at least said first insulating layer over source regions that exposes said source;

forming a first conductive layer over said base conductive layer and filling said contact hole thereby forming an electrical contact to said source;

forming a first photoresist mask for defining areas for a plurality of spatially separated individual cell units on said first conductive layer;

etching portions of said first conductive layer through said first photoresist mask forming an groove in said first conductive layer between adjacent cell units, said groove having vertical sidewalls and having a depth less than a thickness of said first conductive layer;

removing said first photoresist mask;

forming first spacers on said sidewalls of said groove;

anisotropically etching said base conductive layer and said first conductive layer using said first spacers as an etching mask, thereby forming a plurality of electrodes having upright extending portions, said anisotropic etching exposing said first insulation layer in an area under said groove, but leaving a thickness of said base conductive layer in the areas of said individual cell units;

removing said first spacers;

forming a conformal dielectric layer covering said electrodes, said base conductive layer, and said first insulation layer; and forming a top plate electrode over said conformal dielectric layer which connects said top plate electrode of adjacent capacitors thus forming random access memory devices.

12. The method of claim 11 where said base conductive layer has a thickness in a range between about 2000 and 4000 Angstroms, said base conductive layer is formed of polysilicon, and said base conductive layer has a dopant concentration in a range of between about 1E20 and 1E 22 atoms/cm$^3$.

13. The method of claim 11 wherein said first conductive layer has a thickness in a range between about 4000 and 12000 Angstroms and said first conductive layer has a dopant concentration in a range of between about 1E20 and 1E22 atoms/cm$^3$.

14. The method of claim 11 wherein said first spacers have a width in a range between about 0.1 and 0.2 um and said first spacers are formed a material selected from the group consisting of silicon nitride and silicon oxide.

15. The method of claim 11 wherein said conformal dielectric layer has a thickness in a range between about 45 and 60 Angstroms and is formed of a material selected from the group consisting of silicon oxide, silicon nitride and $Ta_2O_5$.

16. The method of claim 11 wherein said top plate electrode has a thickness in a range between about 1000 and 2000 Angstroms and is formed of polysilicon.

17. A method of fabricating dynamic random access memory devices, said memory devices having a source, a drain, a gate element and a capacitor, which comprises the steps of:

forming a first insulation layer over a substrate surface;

forming a base conductive layer over said first insulation layer;

forming a channel through said base conductive layer and through an upper portion of said first insulation layer, said channel having vertical sidewalls;

forming polysilicon sidewall spacers on said sidewalls of said channel;

forming a contact hole using said polysilicon sidewall spacers as an etch mask through at least said first insulating layer over source regions that exposes said source;

forming a first conductive layer over said base conductive layer and filling said contact hole thereby forming an electrical contact to said source;

forming a first photoresist mask for defining areas for a plurality of spatially separated individual cell units on said first conductive layer;

etching portions of said first conductive layer through said first photoresist mask forming a groove in said first conductive layer between adjacent cell units, said groove having vertical sidewalls and having a depth less than a thickness of said first conductive layer;

removing said first photoresist mask;

forming first spacers on said sidewalls of said groove;

anisotropically etching said base conductive layer and said first conductive layer using said first spacers as an etching mask, thereby forming a plurality of electrodes having upright extending portions, said anisotropic etching exposing said first insulation layer in an area under said groove, but leaving a thickness of said base conductive layer in the areas of said individual cell units;

isotropically etching said exposed first insulation layer under said groove using said plurality of said electrodes as an etch mask;

removing said first spacers;

forming a conformal dielectric layer covering said electrodes, said base conductive layer, and said first insulation layer; and forming a top plate electrode over said conformal dielectric layer which connects said top plate electrode of adjacent capacitors thus forming random access memory devices.

18. The method of claim 17 wherein said first conductive layer has a thickness in a range between about 4000 to 12000 Angstroms.

19. The method of claim 17 wherein said first conductive layer has a dopant concentration in a range of between about 1E20 and 1E22 atoms/cm$^3$.

20. The method of claim 17 wherein said groove has a depth in a range between about 500 and 2000 Angstroms.

21. The method of claim 17 wherein said first spacers have a width in a range between about 0.1 and 0.2 um and said first spacers are formed of a material selected from the group consisting of silicon nitride and silicon oxide.

22. The method of claim 17 wherein said conformal dielectric layer has a thickness in a range between about 45 and 60 Angstroms and is formed of a material selected from the group consisting of silicon oxide, silicon nitride, and $Ta_2O_5$.

* * * * *